(12) United States Patent
Saito et al.

(10) Patent No.: US 9,035,332 B2
(45) Date of Patent: May 19, 2015

(54) SEMICONDUCTOR LIGHT EMITTING ELEMENT ARRAY

(71) Applicant: STANLEY ELECTRIC CO., LTD., Meguro-ku, Tokyo (JP)

(72) Inventors: Tatsuma Saito, Yokohama (JP); Mamoru Miyachi, Okegawa (JP); Takako Chinone, Tokyo (JP); Noriko Nihei, Sagamihara (JP); Takanobu Akagi, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 13/779,694

(22) Filed: Feb. 27, 2013

(65) Prior Publication Data

US 2013/0221384 A1    Aug. 29, 2013

(30) Foreign Application Priority Data

Feb. 29, 2012    (JP) .................................. 2012-043042

(51) Int. Cl.
*H01L 33/44*        (2010.01)
*H01L 33/58*        (2010.01)
(Continued)

(52) U.S. Cl.
CPC ................ *H01L 33/44* (2013.01); *H01L 33/58* (2013.01); *H01L 27/156* (2013.01); *H01L 33/0079* (2013.01); *H01L 33/504* (2013.01)

(58) Field of Classification Search
CPC ..... H01L 33/20; H01L 25/0756; H01L 33/08; H01L 33/38; H01L 33/46; H01L 33/385; H01L 33/24; H01L 25/075; H01L 33/486; H01L 33/10; H01L 33/44; H01L 33/58; H01L 33/0079; H01L 33/504; H01L 27/156
USPC ............................................................ 257/88
See application file for complete search history.

(56) References Cited

U.S. PATENT DOCUMENTS 4,114,095 A  *  9/1978  Pankove et al. ........... 324/121 R
4,527,179 A      7/1985  Yamazaki
(Continued)

FOREIGN PATENT DOCUMENTS

EP    2 362 420 A1    8/2011
EP    2 365 527 A2    9/2011
(Continued)

OTHER PUBLICATIONS

Extended European Search Report (EESR) dated Jun. 25, 2013 (in English) issued in counterpart European Application No. 13001005.1.

*Primary Examiner* — Whitney T Moore
(74) *Attorney, Agent, or Firm* — Holtz, Holtz, Goodman & Chick PC

(57) ABSTRACT

A semiconductor light emitting element array contains: a support substrate; a plurality of semiconductor light emitting elements disposed on said support substrate, a pair of adjacent semiconductor light emitting elements being separated by street, each of the semiconductor light emitting elements including; a first electrode formed on the support substrate, a semiconductor lamination formed on the first electrode and including a stack of a first semiconductor layer having a first conductivity type, an active layer formed on the first semiconductor layer, and a second semiconductor layer formed on the active layer, and having a second conductivity type different from the first conductivity type, and a second electrode selectively formed on the second semiconductor layer of the semiconductor lamination; and connection member having electrical insulating property and optically propagating property, disposed to cover at least part of the street between a pair of adjacent semiconductor laminations.

20 Claims, 7 Drawing Sheets

(51) Int. Cl.
*H01L 27/15* (2006.01)
*H01L 33/00* (2010.01)
*H01L 33/50* (2010.01)

(56) References Cited

U.S. PATENT DOCUMENTS

| | | | |
|---|---|---|---|
| 4,984,034 A | 1/1991 | Yamazaki | |
| 6,650,044 B1 | 11/2003 | Lowery | |
| 6,696,703 B2 | 2/2004 | Mueller-Mach et al. | |
| 7,049,159 B2 | 5/2006 | Lowery | |
| 7,183,577 B2 | 2/2007 | Mueller-Mach et al. | |
| 7,709,849 B1 | 5/2010 | Kal et al. | |
| 2006/0278886 A1* | 12/2006 | Tomoda et al. | 257/99 |
| 2007/0257708 A1* | 11/2007 | Shimokawa et al. | 327/5 |
| 2010/0065872 A1* | 3/2010 | Lee | 257/98 |
| 2010/0133555 A1* | 6/2010 | Negley | 257/88 |
| 2010/0151604 A1 | 6/2010 | Kal et al. | |
| 2010/0213474 A1 | 8/2010 | Hsu et al. | |
| 2010/0246160 A1* | 9/2010 | Ito et al. | 362/84 |
| 2011/0180817 A1* | 7/2011 | Ishizaki et al. | 257/88 |
| 2011/0204387 A1 | 8/2011 | Kim et al. | |
| 2011/0210311 A1 | 9/2011 | Kim et al. | |
| 2011/0210351 A1 | 9/2011 | Kim et al. | |
| 2011/0210352 A1 | 9/2011 | Lee et al. | |

FOREIGN PATENT DOCUMENTS

| | | |
|---|---|---|
| EP | 2 367 203 A1 | 9/2011 |
| JP | 2001-156331 A | 6/2001 |
| JP | 2001-244507 A | 9/2001 |
| JP | 2002-185048 A | 6/2002 |

* cited by examiner

FIG. 5  *PRIOR ART*

SEMICONDUCTOR LIGHT EMITTING ELEMENT ARRAY

CROSS REFERENCE TO RELATED APPLICATION

This application is based upon and claims the benefit of priority of the prior Japanese Patent Application No. 2012-043042, filed on Feb. 29, 2012, the entire contents of which are incorporated herein by reference.

FIELD OF THE INVENTION

This invention relates to a semiconductor light emitting element array and its manufacture.

BRIEF DESCRIPTION OF THE DRAWINGS

FIG. 5 is a schematic cross section of a conventional semiconductor light emitting element array 200.

BACKGROUND

Figure 1A:
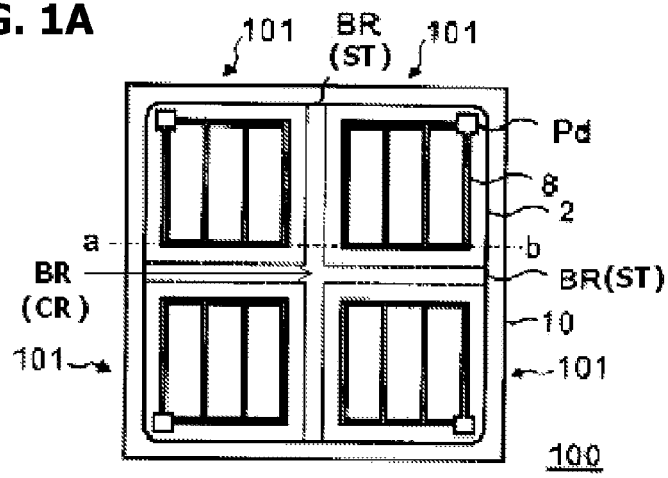
FIGS. 1A and 1B are a schematic plan view and a schematic cross section of a parallel connection type semiconductor light emitting element array 100 according to embodiment of this invention.

Semiconductor light emitting devices are used for illumination, for example as automobile head lamps. For example, semiconductor light emitting diode arrays (LED arrays) including a plurality of semiconductor light emitting diode elements (LED elements) connected in series, or in parallel, or in parallel and in series are used as the semiconductor light emitting devices (for example, see Japanese Laid-open Patent Publication No. 2001-156331).

FIG. 5 shows a cross section of a conventional LED array 200. An LED array 200 has a structure in which a plurality of gallium nitride series semiconductor light emitting diode elements (LED elements) 201 are disposed on a support substrate 210. Here, the term "gallium nitride series" means group III-V compound semiconductor $Al_xGa_yIn_zN$ (0<or=x<or=1, 0<or=y<or=1, 0<or=z<or=1, x+y+z=1).

Respective LED elements are, for example, blue light emitting elements, each having at least a GaN series light emitting part 202 including an n-type GaN layer, an active layer, and a p-type GaN layer, a reflection electrode 203 formed for example of Ag or Al on a rear surface of the light emitting part 202, a wiring layer 208 disposed on a front surface of the light emitting part 202 for diffusing current supplied from a current supply pad into the light emitting part 202, and a melt adhesion layer 206 for connecting the reflection electrode 203 and the support substrate 210.

A yellow fluorescent material (phosphor) layer 218 formed of a transparent resin including yellow fluorescent (phosphor) powder 219 is coated on the surface of the LED elements 201. White lights can be emitted from the LED array 200, by the combination of blue light emitting LED elements 201 and the fluorescent layer 218 containing yellow fluorescent powder 219.

In the LED array 200, a plurality of LED element regions (EL) 201 are separated by an intervening region (isolating groove or street ST). The fluorescent layer 218 fills the street ST as well as covering the LED elements 201. The amount of fluorescent powder 219 at the street ST becomes higher than that on the LED element 201. Further, there is no blue light emission at the street ST. Therefore, the lights L1 emitting from the street ST become more yellowish (color temperature becomes lower) than the lights L2 emitting from the LED element region EL. Therefore, the conventional LED array 200 may produce uneven color distribution.

Also, lights emitting from the street ST are low since there is no light emitting element. Therefore, the conventional LED array may produce uneven brightness distribution.

SUMMARY

According to one aspect of this invention, there is provided a semiconductor light emitting element array comprising:
 a support substrate;
 a plurality of semiconductor light emitting elements disposed on said support substrate, a pair of adjacent semiconductor light emitting elements being separated by street, each of the semiconductor light emitting elements including;
  a first electrode formed on the support substrate,
  a semiconductor lamination formed on the first electrode and including a stack of a first semiconductor layer having a first conductivity type, an active layer formed on the first semiconductor layer, and a second semiconductor layer formed on the active layer, and having a second conductivity type different from the first conductivity type, and
  a second electrode selectively formed on the second semiconductor layer of the semiconductor lamination; and
 connection member having electrical insulating property and optically propagating property, disposed to cover at least part of the street between a pair of adjacent semiconductor laminations.

According to another aspect of this invention, there is provided a method of manufacturing a semiconductor light emitting element array comprising steps of:
 (a) growing on a growth substrate an initial growth layer having electrical insulating property and optical propagating property;
 (b) growing semiconductor lamination including a first semiconductor layer of a first conductivity type on the initial growth layer, an active layer on the first semiconductor layer, and a second semiconductor layer of a second conductivity type different from the first conductivity type on the active layer;
 (c) selectively forming a first electrode on a surface of the second semiconductor layer, forming a first adhesion layer covering the first electrode, defining a first region of the semiconductor lamination covered by the first adhesion layer and a second region of the semiconductor lamination where the second semiconductor layer is exposed;
 (d) removing the second region of the semiconductor lamination to expose the initial growth layer, and leave the first region of the semiconductor lamination;

(e) forming a second adhesion layer selectively on a support substrate;

(f) adhering the growth substrate and the support substrate in such a manner that the first adhesion layer and the second adhesion layer are brought into contact each other, melt-adhering the first and second adhesion layers, to form a joined structure including the semiconductor lamination and the support substrate;

(g) removing the growth substrate from the joined structure to expose the initial growth layer;

(h) removing the exposed initial growth layer in area corresponding to the first region of the semiconductor lamination to expose the first semiconductor layer and leave the initial growth layer in area corresponding to the second region of the semiconductor lamination;

(i) selectively forming a second electrode on the exposed first semiconductor layer.

The object and advantages of the invention will be realized and attained by means of the elements and combinations particularly pointed out in the claims.

It is to be understood that both the foregoing general description and the following detailed description are exemplary and are not restrictive of the invention, as claimed.

DESCRIPTION OF THE PREFERRED EMBODIMENTS

Figure 1B:
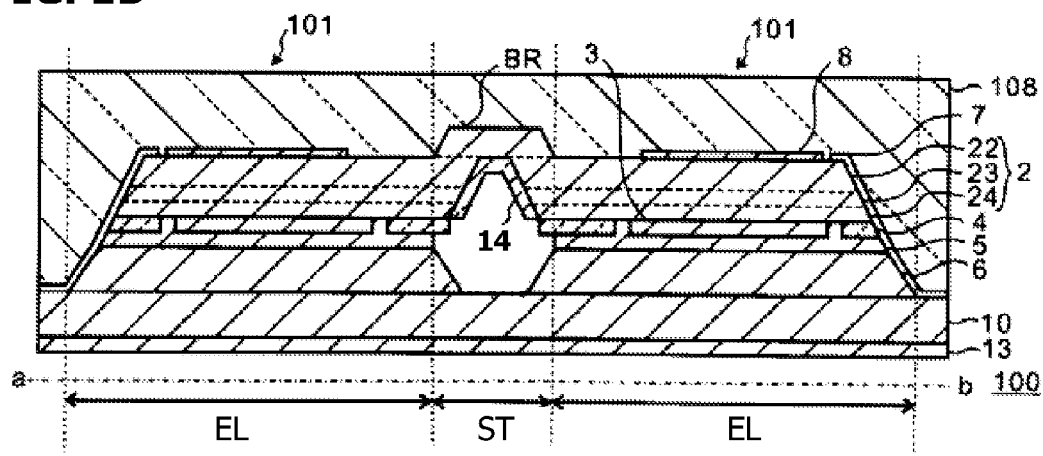

FIG. 1A is a schematic plan view of an LED array 100 including a plurality of semiconductor light emitting (LED) elements 101 connected in parallel according to an embodiment of this invention, and FIG. 1B is a schematic cross section of the LED array 100 along line ab. The LED array 100 is formed of four LED elements 101 disposed on a support substrate 10 in 2×2 matrix configuration, and connected in parallel.

Each of the LED elements 101 includes a support substrate 10, a GaN series light emitting portion (device structure lamination) 2 including an n-type GaN layer 22, an active layer 23, and a p-type GaN layer 24, a reflection electrode 3 formed for example of Ag or Al and an etching stopper layer 4 formed for example of silicon oxide, both located on a rear (substrate side) surface of the device structure lamination 2, a wiring layer 8 disposed on a front surface of the n-type GaN layer 22 for diffusing current supplied from a current supply pad Pd into the device structure lamination 2, a melt adhesion layer including a first adhesion layer 5 and a second adhesion layer 6 for connecting the reflection electrode 3 and the support substrate 10, a protection layer (insulating layer) 7 covering outer side surfaces of the device structure lamination 2 and melt adhesion layer, and a whole surface electrode 13 formed on the whole rear surface of the support substrate 10. A whole surface electrode 13 is formed on a rear surface of the conductive support substrate 10. Each LED element 101 is, for example a blue light emitting element.

The device structure laminations 2 of the LED elements 101 are formed on the substrate and shaped in four islands as illustrated in FIG. 1A. As depicted in FIG. 1B, a pair of adjacent LED element portions EL are separated from each other by a street ST. When a central area among the four islands is called a cross region CR, four streets ST extend from the cross region CR toward upward/downward and right side/left side ends of the laminations 2. The cross region CR can also be regarded as a street because it is between diagonally adjacent islands. Bridge portions (connecting portions) BR are formed to bridge adjacent islands of the device structure laminations 2, i.e. to cover the space defined at the streets ST (space surrounded by the device structure laminations 2, the melt adhesion layers and the support substrate 10) including the cross region CR. Adjacent islands of the device structure laminations 2 (adjacent LED elements 101) are mutually connected (mechanically bridged) by a bridge portion BR. The bridge portion BR is formed to project upward from the surface of the device structure lamination 2.

A protection and reflection film 14 is formed on inner side surfaces of the islands of the device structure lamination 2 and the lower surfaces of the bridge portions BR. Under-fill material may be filled in the space surrounded by the protection and reflection film 14, the melt adhesion layer and the support substrate 10, to support the bridge portion BR.

The bridge portion BR is formed, for example of an undoped GaN layer 21 grown at initial stage of the epitaxial growth (see FIG. 2A), is electrically insulating and can guide lights. The protection and reflection layer 14 has, for example lamination structure of $SiO_2$ and Ag, and is electrically insulating and optically reflecting.

A fluorescent layer 108 formed of transparent resin and fluorescent powder, for example yellow fluorescence powder, is coated on the surfaces of the LED elements 101 (device structure laminations 2) and bridge portions BR.

Lights are produced in the device structure laminations 2 (especially in the active layer 23) and are emitted in every direction from the element portions EL. The reflection electrode 3 and the protection and reflection film 14 reflect incoming lights. Lights can be guided into and propagated in the bridge portions BR having the light guiding property and emitted outward from the streets ST. Thus, uneven brightness distribution between the LED element portions EL and the streets ST is mitigated or suppressed.

The space defined at the streets ST (space enclosed by the device structure lamination 2, the melt adhesion layer, and the support substrate 10) is capped or covered by the bridge portions BR. When the fluorescent layer 108 is coated, the bridge portions BR block the fluorescent material from entering into this space. The amount of fluorescent powder coated on the device structure lamination 2 and that on the bridge portions BR (above the street ST) become mostly equivalent. Therefore, uneven color distribution between the LED element portion EL and the street ST is mitigated or suppressed. Strictly, the amount of the fluorescent powder on the street ST is less than that on the LED element portions EL, by the thickness of the bridge portions BR.

Figure 1C:
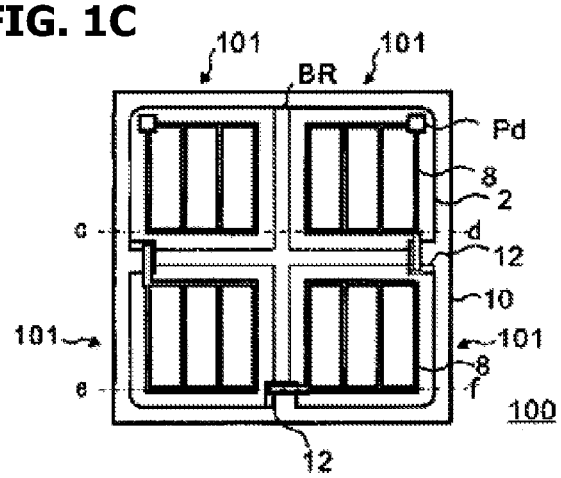
FIG. 1C is a schematic plan view of a serial connection type semiconductor light emitting element array 100 according to embodiment of this invention.

FIG. 1C is a schematic plan view of an LED array 100 according to embodiment of this invention, in which semiconductor light emitting (LED) elements 102 are connected in series.

In the embodiment in which four nitride semiconductor light emitting elements (LED elements) 101 of the LED array 100 are disposed on a support substrate in 2×2 matrix configuration, it is possible to connect them in series.

In this case, parts of the device structure laminations 2 near the end area of three streets ST (right, left, and downward streets in FIG. 1C) are removed to expose a p-side electrode 12 which is constituted of the reflection electrode 3 and the first adhesion layer 5. The exposed p-side electrode 12 is connected electrically with the n-side wiring layer 8 of the adjacent LED element 101, for example by elongating the wiring layer 8 to reach and overlap the p-side electrode 12. An insulating layer 9 is formed on the surface of the support substrate 10 preliminary to formation of the second adhesion layer 6 to avoid short circuit between the adjacent LED elements 101 (see FIGS. 3A, 3B). There is no whole surface electrode on the rear surface of the support substrate 10.

In the LED array 100 of the serial connection, bridge portions are formed between adjacent LED elements 101

(device structure laminations 2) except the above-mentioned three locations where the p-side electrode 12 is connected with the n-side wiring layer 8. By the bridge structures, lights produced in the device structure lamination (especially the active layer 23) are emitted not only from the LED element portions EL, but also from the streets ST after propagation in the bridge portions BR having the light guiding property. The amount of fluorescent powder coated on the device structure lamination 2 and that on the bridge portions BR (above the street ST) become mostly equivalent. Therefore, uneven brightness distribution and uneven color distribution between the LED element portion EL and the street ST are mitigated or suppressed.

The LED array 100 may have other constructions such as one in which LED elements 101 are aligned in one row, e.g. 1×4 matrix configuration, and are electrically connected in parallel or in series. It is also possible to adapt matrix configuration including three rows or more. The number, configuration, and connection style of the LED elements may be changed according to necessity. In any constructions, at least some bridge is provided between adjacent LED elements 101 (device structure laminations 2) to cover street area.

A method of manufacturing the LED array 100 of parallel connection depicted in FIGS. 1A and 1B will be described hereinafter referring to FIGS. 2A-2R, which are cross sections along the line ab shown in FIG. 1A. Cross sections illustrate two LED elements 101 among four LED elements, and other two LED elements are simultaneously manufactured.

Figure 2A:
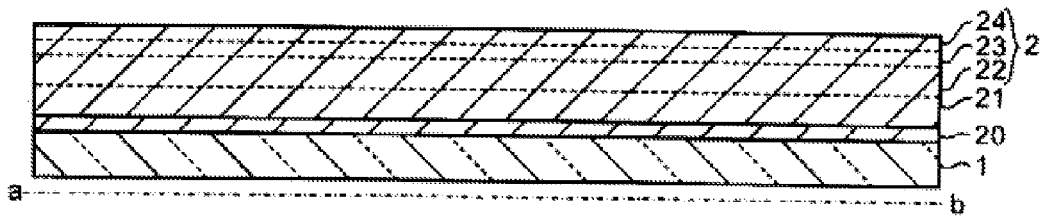
FIGS. 2A-2R are schematic cross sections illustrating manufacture processes of the parallel connection type semiconductor light emitting element array 100 according to the embodiment of this invention.

As depicted in FIG. 2A, a growth substrate (for example, a C plane sapphire substrate) 1 capable of growing $Al_xGa_yIn_zN$ ($0<\text{or}=x<\text{or}=1$, $0<\text{or}=y<\text{or}=1$, $0<\text{or}=z<\text{or}=1$, $x+y+z=1$) by organic metal chemical vapor deposition (MOCVD) is prepared. Semiconductor lamination structure comprising $Al_xGa_yIn_zN$ ($0<\text{or}=x<\text{or}=1$, $0<\text{or}=y<\text{or}=1$, $0<\text{or}=z<\text{or}=1$, $x+y+z=1$) layers 20, 21, and 2 is grown on the growth substrate 1 by MOCVD.

More specifically, the sapphire substrate 1 is loaded in a MOCVD system, and heating (thermal cleaning) is done at 1000 degrees centigrade for 10 minutes in hydrogen atmosphere. Then, a low temperature buffer layer (GaN layer) 20 is grown at about 500 degrees centigrade, by supplying TMG (tri-methyl-gallium) 10.4 micromol/min, $NH_3$ 3.3 SLM (standard liter per minute), for three minutes. The growth substrate 1 is a single crystal substrate having lattice constant capable of epitaxially growing a GaN layer, and is selected from the materials transparent for the light at the wavelength of 362 nm, which is the absorption edge of the GaN, for enabling removal of the substrate by laser lift-off. Spinel, SiC, ZnO etc. may also be used as well as sapphire.

Then, the substrate 1 is heated to 1000 degrees centigrade and maintained thereat for 30 seconds to crystallize the low temperature buffer layer 20. At the same temperature, an underlying GaN layer (undoped GaN layer) 21 is grown to a thickness of about 5 micrometers by supplying TMG 45 micromol/min, $NH_3$ 4.4 SLM for 100 minutes. Commonly, the undoped GaN layer is grown to a thickness in a range of 1-3 micrometers. In this embodiment, bridge structure is made from the undoped GaN layer 21, and the undoped GaN layer is grown to a thickness of bout 5 micrometers for securing the mechanical strength of the bridge structure BR (see FIGS. 1A and 1B). When the thickness of the undoped GaN layer is made to be too thick, cracks may be generated in the growing layer due to stress depending on the critical thickness. Thus, the maximum thickness of the undoped GaN layer is preferably selected to be about 10 micrometers. The preferable thickness of the undoped GaN layer 21 is in a range of 4-10 micrometers.

Continuously at 1000 degrees centigrade, a Si-doped n-type GaN layer 22 is grown to a thickness of about 5 micrometers by supplying TMG 45 micromol/min, $NH_3$ 4.4 SLM, and $SiH_4$ $2.7\times10^{-9}$ micromol/min, for 100 minutes.

Then, an active layer 23, more specifically multi-quantum-well (MQW) structure, is grown at 700 degrees centigrade. Here, an InGaN/GaN lamination is set as one period, and growth of 5 periods is performed. In one period, an InGaN well layer of a thickness of about 2.2 nm is grown by supplying TMG 3.6 micromol/min, TMI (tri-methyl-indium) 10 micromol/min, and $NH_3$ 4.4 SLM, for 33 seconds, and a GaN barrier layer of a thickness of about 15 nm is grown by supplying TMG 3.6 micromol/min, and $NH_3$ 4.4 SLM, for 320 seconds.

Then, a p-type layer 24, more specifically combination of a Mg-doped p-type AlGaN layer (clad layer) and a Mg-doped p-type GaN layer (contact layer), is grown. After the growth of the active layer 23, the temperature is raised to 870 degrees centigrade, a Mg-doped p-type AlGaN layer (clad layer) is grown to a thickness of about 40 nm by supplying TMG 8.1 micromol/min, TMA (tri-methyl-aluminium) 7.5 micromol/min, $NH_3$ 4.4 SLM, and $Cp_2Mg$ (bis-cyclopentadienyl Mg) $2.9\times10^{-7}$ micromol/min for 5 minutes. Then, a Mg-doped p-type GaN layer (contact layer) is grown to a thickness of about 150 nm by supplying TMG 18 micromol/min, $NH_3$ 4.4 SLM, and $Cp_2Mg$ $2.9\times10^{-7}$ micromol/min for 7 minutes.

Figure 2B:
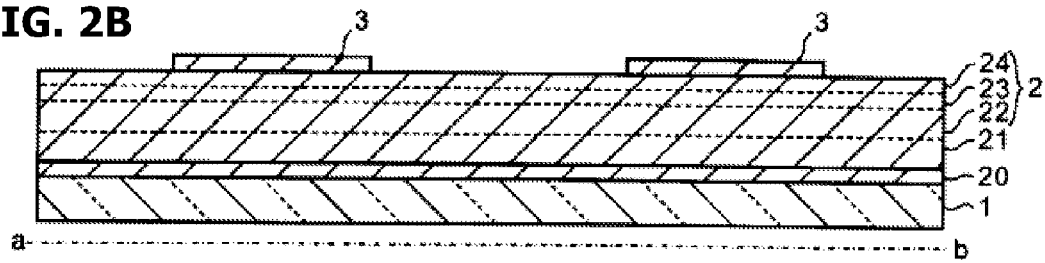
Figure 2C:
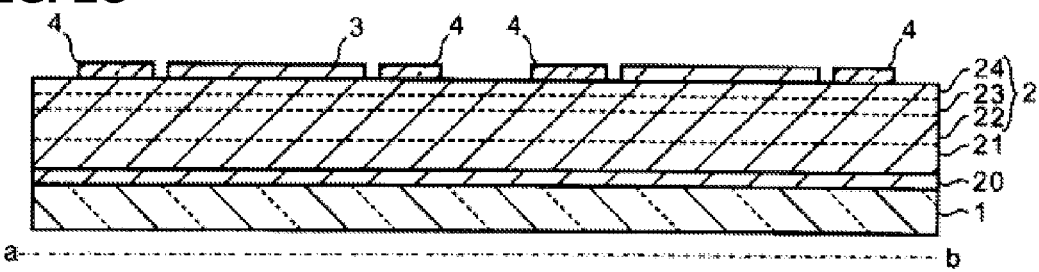

As depicted in FIG. 2B, an Ag layer of a thickness of 200 nm is formed on the surface of the device structure lamination 2 (p-type GaN layer 24) by electron beam evaporation, and is patterned by photolithography and etching, to form a reflection electrode 3. The reflection electrode may also be patterned by well-known lift-off. The reflection electrode 3 may also be formed of Pt, Pd, Ni, Ti, Al, and alloys thereof, as well as Ag. As depicted in FIG. 2C, an etching stopper layer 4 formed of $SiO_2$ preferably of a same thickness as the reflection electrode 3 is formed on the device structure lamination 2 (p-type GaN layer 24) surrounding the reflection electrode 3, by sputtering. The etching stopper layer 4 serves as an etch stopper in the etching step as described later referring to FIGS. 5O and 5P.

Figure 2D:
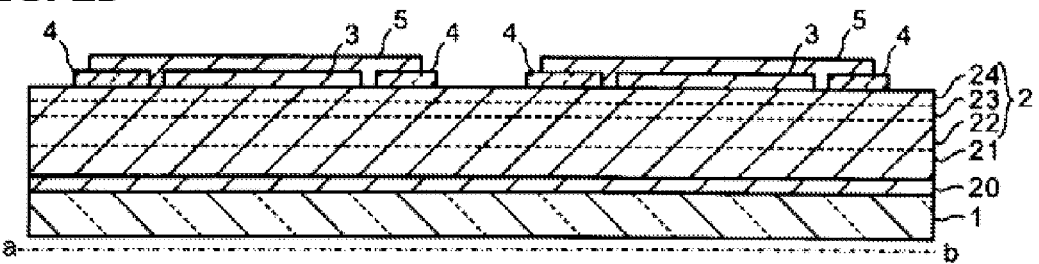

As depicted in FIG. 2D, a first adhesion layer 5 made of an Au film of 200 nm thick is formed on a region including the reflection electrode 3 and the etching stopper layer 4. The first adhesion layer 5 may be formed after a diffusion preventing layer, an insulating layer, etc. are formed on the area including the reflection electrode 3 and the etching stopper layer 4. In case of forming a diffusion preventing layer, an insulating layer etc., for example, a diffusion preventing layer made of a TiW film of 300 nm thick is formed by sputtering. The diffusion preventing film serves to prevent diffusion of a material used as the reflection electrode 3. When Ag is included in the reflection electrode, those materials as Ti, W, Pt, Pd, Mo, Ru, Ir, Au, and alloys thereof can be used. On the diffusion preventing layer, it is preferable to form an insulating layer made of $SiO_2$ by CVD, etc.

Figure 2E:
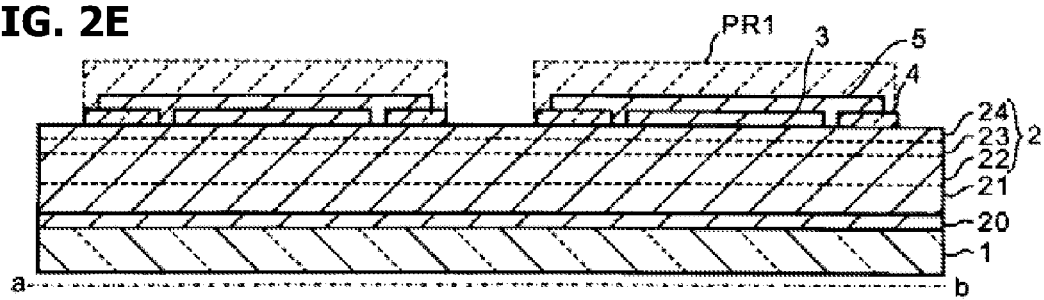
Figure 2F:
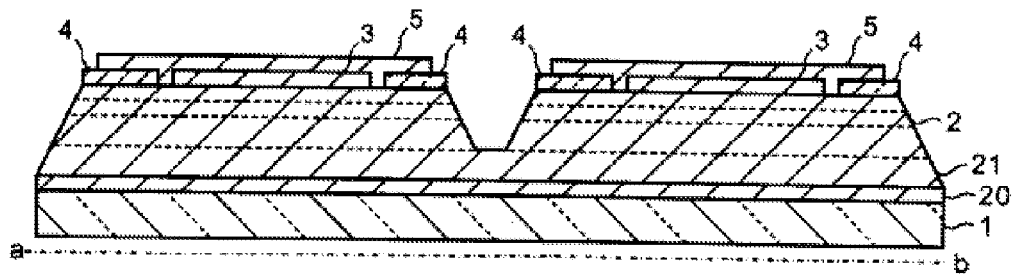

As depicted in FIGS. 2E and 2F, the device structure lamination 2 is divided by etching, forming isolating grooves. Here, the initially grown undoped GaN layer 21 is not etched and left.

Specifically, as depicted in FIG. 2E, a resist pattern PR1 is formed on the device structure lamination 2, covering the reflection electrode 3, the etching stopper layer 4, and the first adhesion layer 5, by using the conventional photolithography. As depicted in FIG. 2F, using the resist pattern PR1 as an etching mask, exposed device structure lamination 2 is etched by dry etching until the surface of the undoped GaN layer 21 is exposed. The resist pattern PR1 is then removed. Remaining undoped GaN layer 21 will form bridge portions BR (see FIGS. 1A and 1B) in the later process.

Figure 2G:
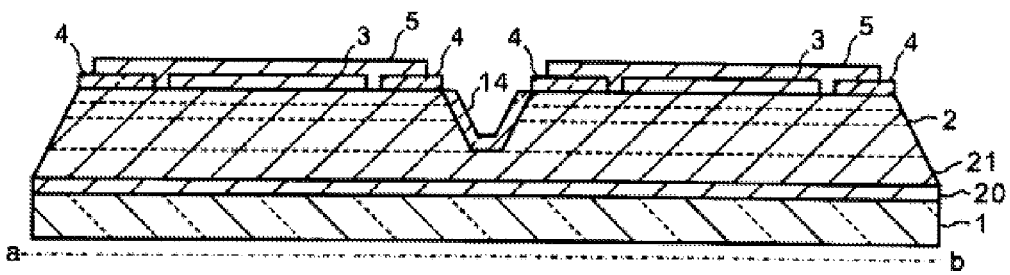

As depicted in FIG. 2G, a protection reflection layer 14 is formed on the etched groove (isolating groove) of the device structure lamination 2. First, a resist pattern exposing only the isolating grooves is formed by photolithography. A $SiO_2$ film 14 is deposited by sputtering to a thickness of about 300 nm in the isolating grooves to form an insulating and protecting film on the isolating grooves. Then, an Ag film is deposited on the $siO_2$ film 14 by sputtering to a thickness of about 150 nm to form a reflection film. Further, Ti (150 nm)/SiO2 (300 nm) lamination is deposited by sputtering. Unnecessary portions are removed by lift-off to leave the protection reflection film 14 only in the isolating grooves. Here, underfill material may be filled in the isolating grooves.

Figure 2H:
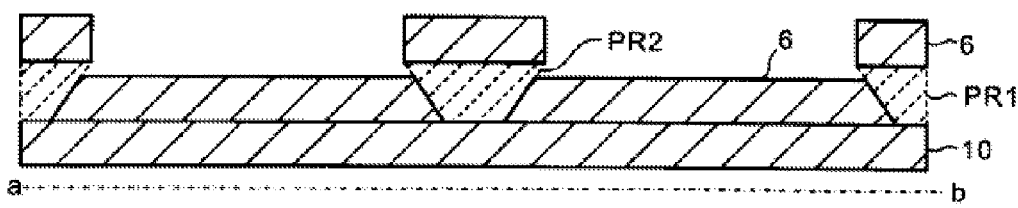

As depicted in FIG. 2H, a support substrate 10, for example a silicon substrate, is prepared. A second adhesion layer 6 made of AuSn (Sn:20 wt %) having a thickness of 1 micometer is formed on the support substrate 10 by resistance heating. The support substrate 10 is preferably formed of a material having a thermal expansion coefficient near those of sapphire ($7.5 \times 10^{-6}$/K) and GaN ($5.6 \times 10^{-6}$/K), and a high thermal conductivity. For example, Si, AlN, Mo, W, CuW etc. may be used. The first adhesion layer 5 and the second adhesion layer 6 may be formed of metals including Au—Sn, Au—In, Pd—In, Cu—In, Cu—Sn, Ag—Sn, Ag—In, Ni—Sn, etc. capable of melt adhesion, or metals including Au capable of diffusion adhesion.

Figure 2I:
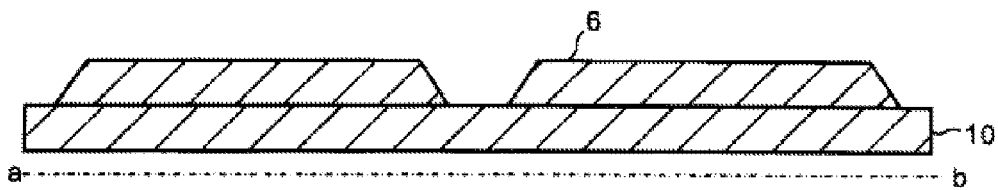

The second adhesion layer 6 may be formed by utilizing lift-off, as depicted in FIGS. 2H and 2I. First, a photoresist (for example photoresist AZ5200 available from Clariant Co.) is coated on a whole surface of a thermally oxidized support substrate 10, and is subjected to prebaking on a hot plate set under 90 degrees centigrade, for about 90 seconds in air. Then, the photoresist layer is pattern-exposed with first exposure amount of 17 mJ using ultraviolet (UV) lights. The photoresist film after the exposure is subjected to reversal baking treatment in air at 120 degrees centigrade, for 90 seconds to cause thermal cross-linking. Then, UV lights are irradiated on the whole surface of the support substrate 10 at reversal exposure amount 600 mJ. Then, the photoresist film is immersed in developing liquid for 130 seconds to perform developing, to obtain desired photoresist pattern PR2 (in areas except the area of the second adhesion layer 6). The photoresist pattern PR2 thus formed has peripheral portion with reverse taper shape (upwardly broadening shape). The resist material and the conditions of photolithography can be changed appropriately.

A metal lamination 6 comprising Ti (150 nm)/Ni (50 nm)/Au (100 nm)/Pt (200 nm)/AuSn (1000 nm, Sn: 20 wt %) is deposited on the support substrate by resistance heating, and subjected to lift-off to form a second adhesion layer 6 having a tapered peripheral shape with respect to the support substrate 10 (upwardly narrowing cross section), as depicted in FIG. 2I. The shape of the second adhesion layer 6 is not limited to the depicted forward taper shape, provided that the angle formed by the surface (upper surface) to be adhered with the first adhesion layer 5 and the side surface is an obtuse angle (angle>90 degrees), and the angle of the side surface with respect to the support substrate is always 0 degree<angle<90 degrees.

The second adhesion layer 6 may also be formed by dry etching or wet etching, as well as lift-off. In these cases, after a metal lamination 6 of Ti (150 nm)/Ni (50 nm)/Au (100 nm)/Pt (200 nm)/AuSn (1000 nm, Sn: 20 wt %) is deposited on a whole surface of a thermally oxidized support substrate 10 by resistance heating, a resist pattern of desired pattern (covering the areas to become the second adhesion layer 6) is formed on the metal lamination 6, and the exposed metal lamination 6 is removed by etching to the interface with the substrate (patterning the metal lamination), to form the second adhesion layer as depicted in FIG. 2I. Dry etching may be done with etchant of Ar, $Cl_2$, and $CF_4$, and wet etching may be done with etchants, for example aquous solution of iodine and ammonium iodide for Au.

Figure 2J:
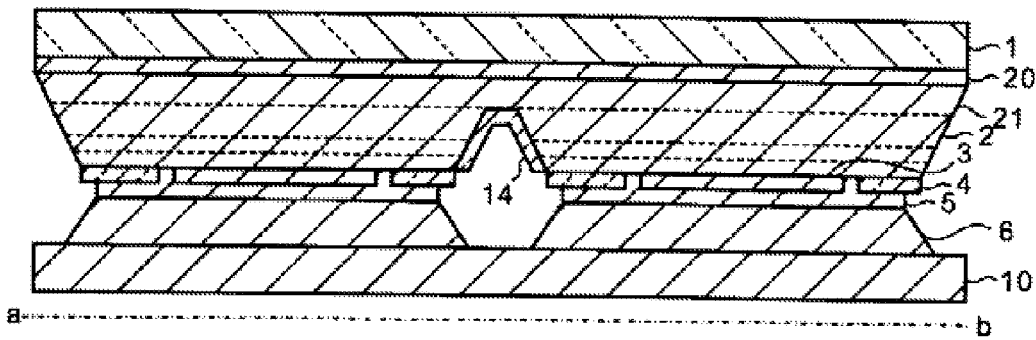

As depicted in FIG. 2J, the first adhesion layer 5 and the second adhesion layer 6 are brought into pressed contact with a pressure of 3 MPa, are heated to 300 degrees centigrade, maintained for 10 minutes, and then cooled down to achieve melt adhesion. An adhesion layer is formed by this melt adhesion. Also, element portions EL and streets ST are defined (see FIG. 1B).

Figure 2K:
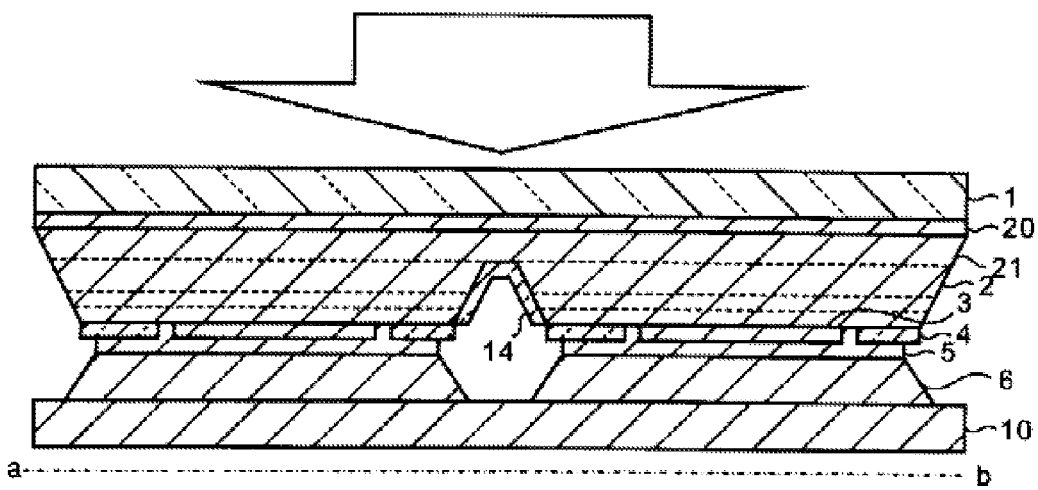
Figure 2L:
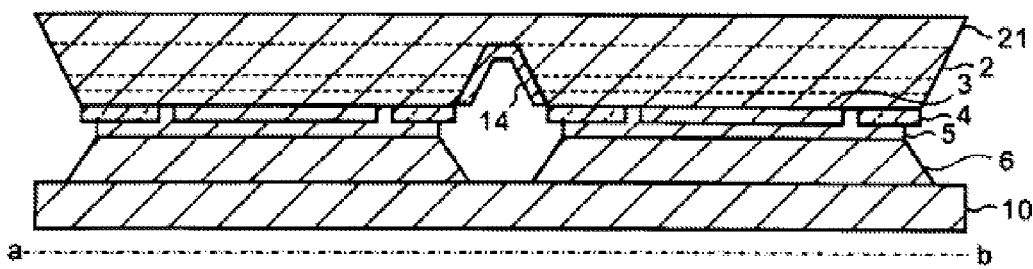

As depicted in FIG. 2K, UV excimer laser lights are irradiated from the rear surface side of the sapphire substrate 1, to heat and decompose the buffer layer 20. The sapphire substrate 1 is separated (removed) from the device structure lamination 2 by laser lift-off, as depicted in FIG. 2L. KrF excimer laser emitting lights of wavelength 248 nm may be used as the laser. Laser power may be about 800 mJ/cm². The GaN layer on the sapphire substrate 1 is decomposed into metal Ga and nitrogen. The new surface exposed after laser lift-off will be the undoped GaN layer 21. Removal of the growth substrate 1 may also be done by other methods than laser lift-off, such as etching.

Then, the initial growth layer (undoped GaN layer) 21 in the element regions EL will be completely removed by etching, to expose the n-type GaN layer 22. In this process, the initially grown layer (undoped GaN layer) 21 in the street regions ST is protected from etching, to be left and constitute bridge portions BR.

Figure 2M:
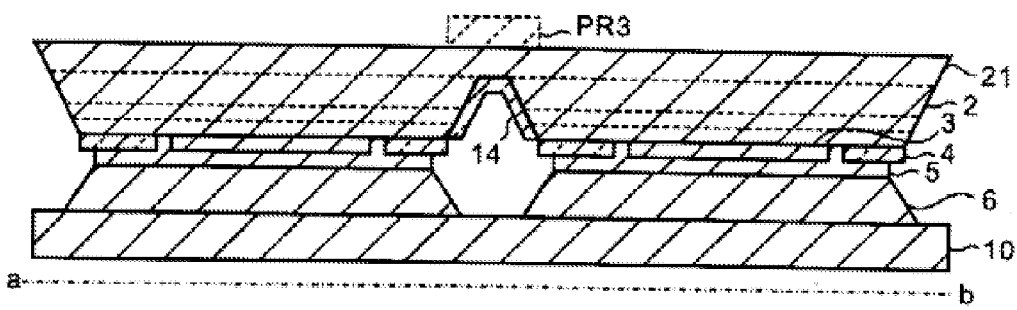
Figure 2N:
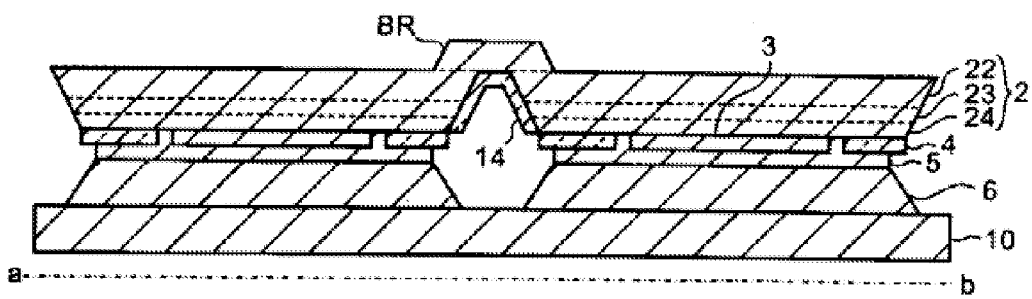

As depicted in FIG. 2M, a photoresist pattern PR3 covering the regions corresponding to the isolating grooves (regions corresponding to streets) is formed on the GaN layer 21. The undoped GaN layer 21 in the exposed areas is removed by etching by its entire thickness (about 5 micrometers in this embodiment) using the photoresist pattern PR as an etching mask, to expose the underlying n-type GaN layers 22 as depicted in FIG. 2N. Thereafter, the photoresist pattern PR3 is removed.

In this way, bridge portions BR formed of initially grown layer (undoped GaN layer 21) can be formed in the street regions. The bridge portions BR are formed of the undoped GaN layer, and have light guiding and electrically isolating (insulating) properties. Thus, a pair of LED elements 2 connected by a bridge BR can be electrically isolated and optically coupled. The surface of the n-type GaN layer 22 exposed by etching is capable of forming electrical contact with an electrode (wiring) 8. The exposed surface of the n-type semiconductor layer 22 may be provided with micro cone structures, for example by alkaline treatment, to improve the light output efficiency.

Figure 2O:
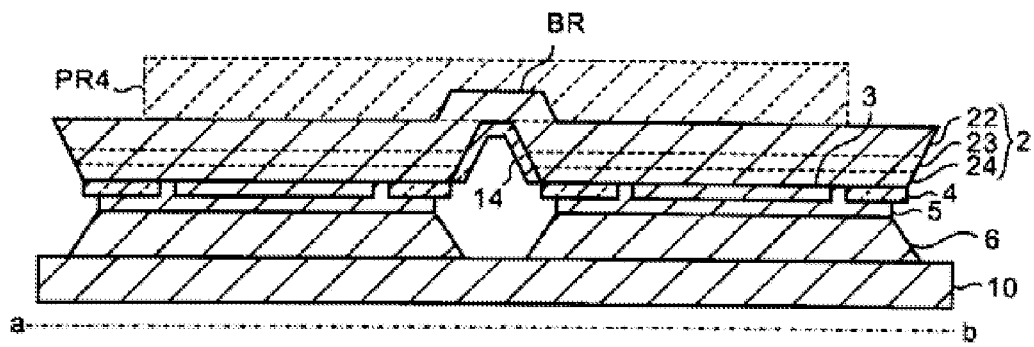
Figure 2P:
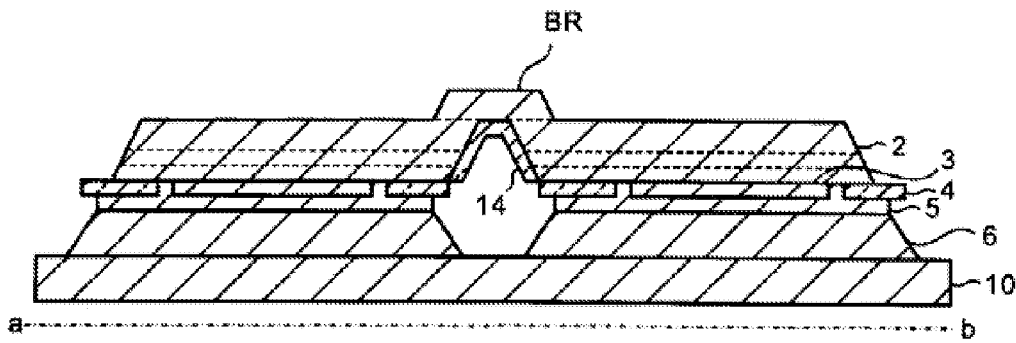

As depicted in FIG. 2O, a photoresist pattern PR4 is formed on the device structure lamination 2 to expose peripheries of the device structure lamination 2. Then, the device structure lamination 2 exposed outside the photoresist pattern PR4 is etched by dry etching using chlorine gas until the etching stopper layer 4 is exposed. As depicted in FIG. 2P, the outer side surface of the device structure lamination 2 takes a tapered shape. When the support substrate 10 assumes a lower position, the outer side surface of the device structure lamination 2 formed on the upper surface of the support substrate 10 has an upwardly decreasing cross section (forward taper with respect to the support substrate 10).

Part of the etching stopper layer 4 and the first adhesion layer 5 may be etched to realize a configuration in which the angle formed by an upper surface and a side surface of the adhesion layer including the first and second adhesion layers (including the reflection electrode 3 and remaining part of the etching stopper layer 4) is larger than 90 degrees, and the side surface does not include any part where the side surface of the adhesion layer forms an angle larger than 90 degrees with the upper surface of the support substrate. The side surface of the adhesion layer forms forward taper with respect to the upper surface of the support substrate.

Figure 2Q:
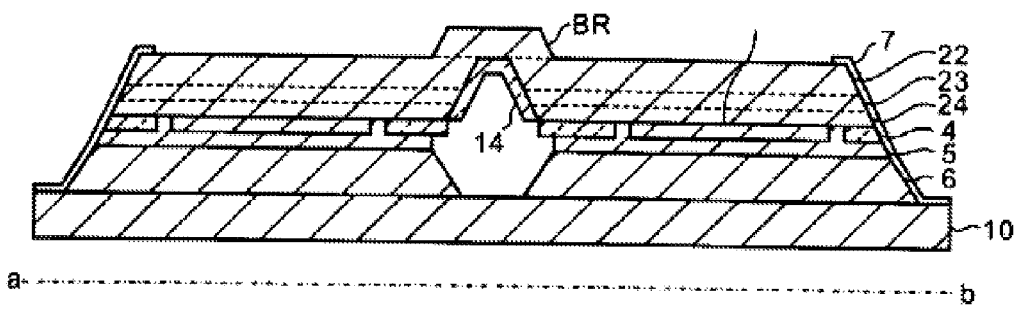

As depicted in FIG. 2Q, a protection film (insulating film) 7 made of $SiO_2$ is formed on the whole upper surface of the device formed by the above-mentioned process by CVD. Selected portions of the protection film 7 formed on the device structure lamination 2 are etched using buffered fluoric acid to expose portions of the surface of the device structure lamination 2 (surface of the n-type GaN layer 22) and the bridge portions BR.

Figure 2R:
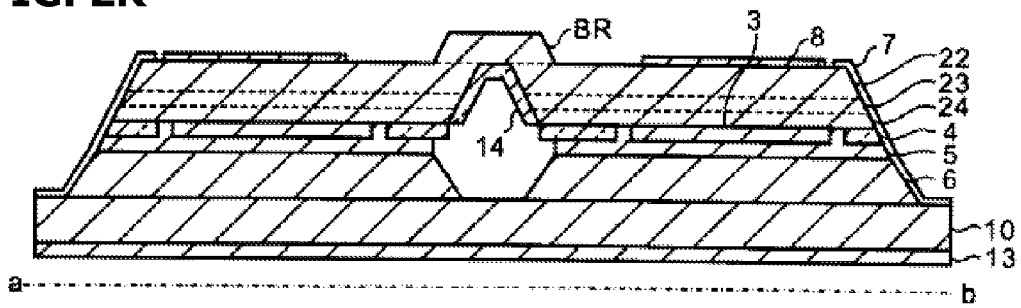

As depicted in FIG. 2R, a Ti layer of a thickness 1 nm, an Al layer of a thickness 200 nm, a Ti layer of a thickness 100 nm, and an Au layer of a thickness 2 micrometers are sequentially deposited on the structure by electron beam deposition, and patterned by lift-off, to form wiring electrodes 8 having a width of about 10 nm on the surface of the n-type GaN layer 22. The width of the wiring electrode is preferably in a range of 3-10 micrometers. The plan shape of the wiring electrode 8 is not limited to the one depicted in FIG. 1A, and may take any shape such as comb tooth shapes, radial shapes, concentric shapes, etc.

Then, the support substrate 10 may be divided by laser scribing or dicing. Finally, fluorescent material is coated on the surface of the LED array 100, to form the fluorescent layer 108 as depicted in FIG. 1B.

The fluorescent layer 108 is formed, for example of fluorescent material containing resin in which fluorescent powder is mixed in binder resin. The fluorescent material may include single or plural species of red fluorescent material ($CaAlSiN_3:Eu^{2+}$, $(Ca, Sr)AlSiN_3:Eu^{2+}$, $Ca_2Si_5N_8:Eu^{2+}$, $(Ca, Sr)_2Si_5N_8:Eu^{2+}$, $KSiF_6:Mn^{4+}$, etc.), yellow fluorescent material ($Y_3Al_5O_{12}:Ce^{3+}$, $(Sr, Ba)_2SiO_4:Eu^{2+}$, $Ca_x(Si, Al)_{12}(O, N)_{16}:Eu^{2+}$, etc.), green fluorescent material ($Lu_3Al_5O_{12}:Ce^{3+}$, $Y_3(Ga, Al)_5O_{12}:Ce^{3+}$, $Ca_3Sc_2Si_3O_{12}:Ce^{3+}$, $CaSc_2O_4:Eu^{2+}$, $(Ba, Sr)_2SiO_4:Eu^{2+}$, $Ba_3Si_6O_{12}N_2:Eu^{2+}$, $(Si, Al)_6(O, N)_8:Eu^{2+}$, etc.), and blue fluorescent material (BAM, etc.). When the LED element 101 is a blue light emitting element, white lights can be emitted from the fluorescent material layer 108 by mixing yellow fluorescent material in the fluorescent material layer 108. The resin material may be silicone resin, epoxy resin, etc. A fluorescent plate formed by sintering fluorescent material without using resin may also be used.

The thickness of the fluorescent material layer 108 is of the order of 20-300 micrometers. An optimum thickness can be selected based on efficiency and grain size of the fluorescent material, desired chromaticity, etc.

An example of forming a fluorescent material layer will be described. First, fluorescent material is mixed in silicone resin. The mixed material is coated on the surface of the device (LED elements 101 and bridges BR) by potting, and cured at about 150 degrees centigrade for 4 hours. A fluorescent material layer 108 of a thickness 200-300 micometers will be formed on the element. Species of the fluorescent material, mixing ratio with resin, and amount of coating are appropriately adjusted based on desired color temperature. The fluorescent material layer will take a shape of approximately semi-sphere due to surface tension, although the curvature changes depending on the shape of the device.

Except the above method, method using a stencil mask (see Japanese Laid-Open Paten Publication No. 2002-185048) and method using atomic layer epitaxy (see Japanese Laid-Open Paten Publication No. 2001-244507) may be employed.

Figure 3A:
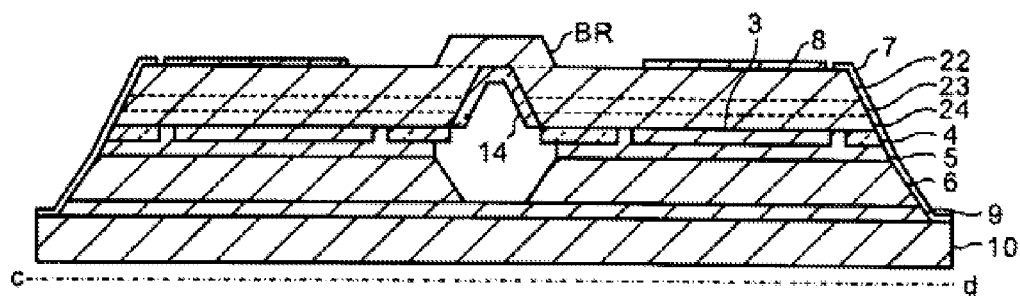
FIGS. 3A and 3B are schematic cross sections depicting manufacture processes of the serial connection type semiconductor light emitting element array 100 according to the embodiment of this invention.
Figure 3B:
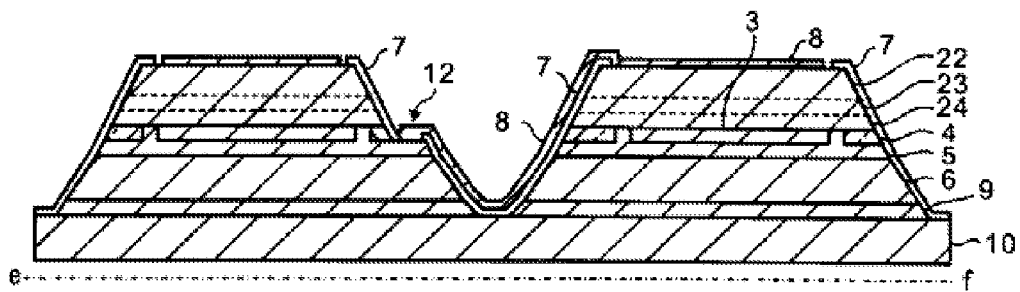

Description will be made on manufacture of the LED array 100 in which LED elements 101 are connected in series. Basic manufacturing processes are similar to the case of parallel connection. Therefore, description will be mainly made on points different from the parallel connection. FIGS. 3A and 3B are schematic cross sections along lines cd and ef in FIG. 1C, in case of connecting LED elements 101 of the LED array 100 in series.

As depicted in FIG. 1C, a support substrate 10 made of silicon is thermally oxidized to form an insulating film (thermally oxidized silicon oxide film) 9 on the surface of the support substrate 10. The thickness of the insulating film is enough if sufficient insulation is secured. There is no whole surface electrode on the rear surface of the support substrate 10. Processes similar to those of FIGS. 2A-2R are performed, using the support substrate 10 having an insulating layer 9 on the upper surface and having no electrode on the lower surface.

As depicted in FIG. 3B, in the connecting area between adjacent LED elements 101, selected portions of the protection film (insulating film) 7 made of silicon oxide deposited on the total upper surface of the LED elements (selected portions of the protection film 7 formed on the device structure lamination 2, and on the electrode 12) are etched by buffered fluoric acid to expose surfaces of the device structure lamination 2 (n-type GaN layer 22) and the electrode 12. A Ti layer of a thickness 1 nm, an Al layer of a thickness 200 nm, a Ti layer of a thickness 100 nm, and an Au layer of a thickness 2 micrometers are sequentially deposited on the structure by electron beam deposition, and patterned by lift-off, thereby connecting the n-type GaN layer 22 of one element and the electrode 12 (p-side electrode) of the adjacent element.

The element structure (device structure lamination 2, the adhesion layer including the first and second adhesion layers) on the support substrate 10 may be shaped to have only one or two sides on which the wiring layer 8 is formed, have outwardly spreading slope.

Figure 4A:
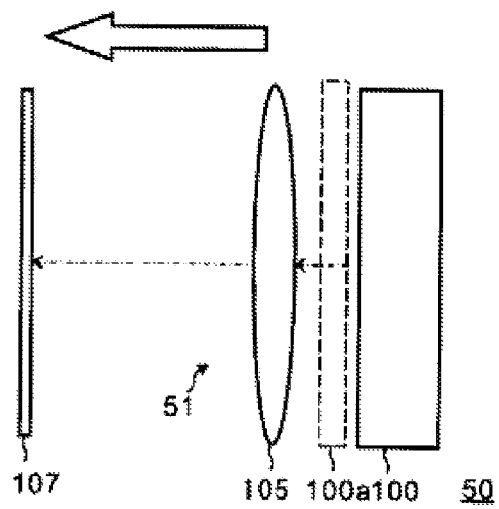
FIGS. 4A and 4B are diagrams illustrating the structure of an automobile lighting device (head lamp) embodying the semiconductor light emitting element array 100 according to the embodiment of this invention.
Figure 4B:
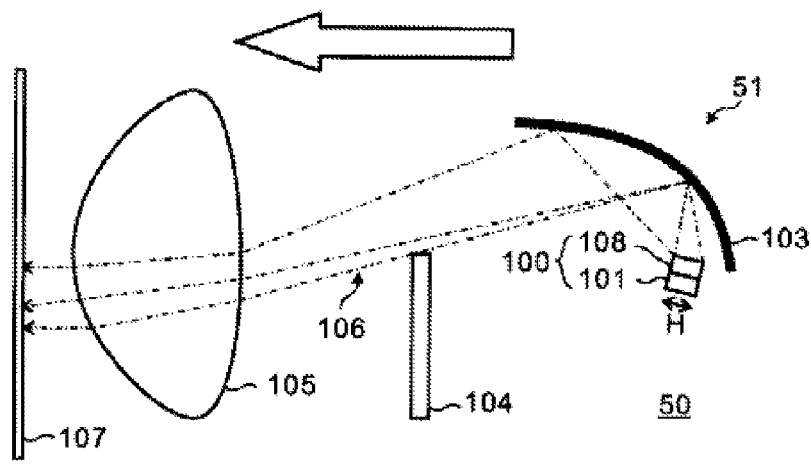
Figure 4B:
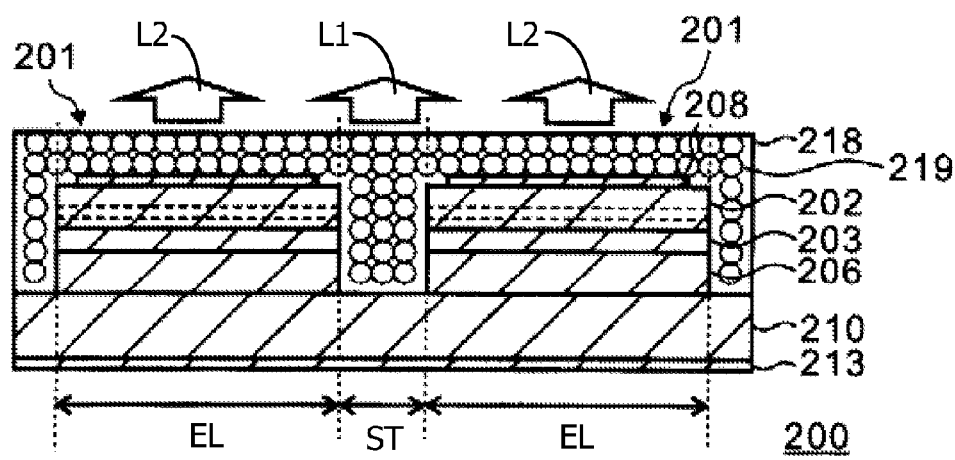

FIG. 4A and FIG. 4B are diagrams showing structures of automotive lightings (headlamps) 50 equipped with the LED arrays 100 according to the embodiment of the present invention.

FIG. 4A shows an example of a projection optical system 51. The projection lens 105 is designed to make optical source image 106 of the LED array 100 on a virtual vertical screen (projection surface) 107 which faces a front of a vehicle.

As shown in FIG. 4B, a projection optical system 51 can be equipped with a multireflector (reflection surfaces) 103 and a projection lens 105, to share the projection lens 105 with a plurality of LED arrays 100. The headlamp 50 shown in FIG. 4B includes light sources formed of at least two LED arrays each having an LED array 101 and a fluorescent material layer 108 covering the LED array, and a projection optical system 51 including reflection surfaces 103 which are multireflectors divided into a plurality of small reflection regions, a shade 104 and a projector lens 105.

As depicted in FIG. 4B, the light source is positioned to make its projecting direction (light emitting surface) upward. The reflection surface 103 is a spheroidal reflection surface whose first focal point is set near the light source and second focal point is set neat the upper edge of the shade 104, and it is positioned to cover the side and the front of the light source so that lights from the light source irradiate the reflection surface 103.

As depicted in FIG. 4B, the reflection surface 103 projects the light source images 106 of the plurality of the LED arrays 100 of the light source to the front of a vehicle and is designed to project the light source images 106 of the LED arrays 100 on the virtual vertical screen (projection surface) 107 which faces the front of the vehicle.

The shade 104 is a shading part for shading a portion of reflected light from the reflection surface 103 to form a cutoff line suitable for a headlamp. The shade 104 is disposed between the projection lens 105 and the light source 102, placing its upper edge near the focal point of the projection lens 105.

The projection lens 105 is positioned on the front of the vehicle and irradiates the reflected light from the reflection surface 103 onto the projection surface 107.

According to the embodiments of this invention described heretofore, in a semiconductor light emitting array having a plurality of semiconductor light emitting elements, at least one bridge is provided between adjacent light emitting elements, wherein the adjacent light emitting elements are not limited to those aligned side by side, but may be any other pair in which some space separate the pair, for example diagonally adjacent pair.

The bridge can prevent filling the space or groove (street) between the pair of light emitting elements with fluorescent material. The amount of the fluorescent material in the street can be set equivalent or lower than the amount of the fluorescent material on the element area (light emitting surface). Thus, color temperature can be uniformalized between the street and the element area, to suppress uneven color distribution.

The bridge can guide light, and hence lights emitted in the element area can propagate in the bridge, and can be taken out from the street. Thus, uneven brightness distribution can be suppressed between the street and the element portion.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

The invention claimed is:

1. A semiconductor light emitting element array comprising:
    a support substrate;
    a plurality of semiconductor light emitting elements disposed on said support substrate, wherein a pair of adjacent semiconductor light emitting elements is separated by a street, and wherein each of the semiconductor light emitting elements comprises:
        a first electrode formed on the support substrate,
        a semiconductor lamination which is formed on the first electrode and which includes a stack of a first semiconductor layer having a first conductivity type, an active layer formed on the first semiconductor layer, and a second semiconductor layer that is formed on the active layer, and that has a second conductivity type different from the first conductivity type, and
        a second electrode selectively formed on the second semiconductor layer of the semiconductor lamination; and
    a connection member which is disposed to bridge over at least a part of the street between a pair of adjacent semiconductor laminations, which defines a space together with the support substrate and the semiconductor light emitting elements, and which comprises an undoped semiconductor layer that has an electrical insulating property and an optical propagating property, wherein the connection member is located on the respective second semiconductor layers of the pair of adjacent semiconductor laminations.

2. The semiconductor light emitting element array according to claim 1, further comprising a first fluorescent material layer formed on surfaces of the semiconductor light emitting elements; and a second fluorescent material layer formed on the connection member.

3. The semiconductor light emitting element array according to claim 1, wherein the connection member covers the street between each pair of adjacent semiconductor laminations.

4. The semiconductor light emitting element array according to claim 1, further comprising a common terminal which is connected electrically to the first electrodes of the plurality of semiconductor light emitting elements, and which is capable of establishing a parallel connection circuit.

5. The semiconductor light emitting element array according to claim 1, further comprising interconnection wiring means for establishing a serial connection of the plurality of the semiconductor light emitting elements, wherein the interconnection wiring means electrically connects the first electrode of one of the plurality of the semiconductor light emitting elements with the second electrode of an adjacent one of the plurality of the semiconductor light emitting elements.

6. The semiconductor light emitting element array according to claim 1, further comprising an insulated reflection film formed on an inner side surface of the semiconductor laminations, and on a lower surface of the connection member.

7. The semiconductor light emitting element array according to claim 1, further comprising an under-fill material that is filled in the space and that supports the connection member.

8. The semiconductor light emitting element array according to claim 1, wherein each of the first semiconductor layer, the active layer, the second semiconductor layer, and the undoped semiconductor layer are formed of gallium nitride series semiconductor.

9. The semiconductor light emitting element array according to claim 8, wherein the support substrate is formed of silicon.

10. The semiconductor light emitting element array according to claim 1, wherein each first electrode is a reflection electrode.

11. The semiconductor light emitting element array according to claim 10, wherein each first electrode is formed of Ag.

12. An automotive lighting comprising:
    a light source; and
    an optical system that projects images of the light source on a projection surface,
    wherein the light source comprises:
    a support substrate,
    a plurality of semiconductor light emitting elements disposed on said support substrate, wherein a pair of adjacent semiconductor light emitting elements are separated by a street, and wherein each of the semiconductor light emitting elements includes:

a first electrode formed on the support substrate, a semiconductor lamination which is formed on the first electrode and which includes a stack of a first semiconductor layer having a first conductivity type, an active layer formed on the first semiconductor layer, and a second semiconductor layer that is formed on the active layer, and that has a second conductivity type different from the first conductivity type, and a second electrode selectively formed on the second semiconductor layer of the semiconductor lamination, and a connection member which is disposed to bridge over at least a part of the street between a pair of adjacent semiconductor laminations, which defines a space together with the support substrate and the semiconductor light emitting elements, and which comprises an undoped semiconductor layer that has an electrical insulating property and an optical propagating property, wherein the connection member is located on the respective second semiconductor layers of the pair of adjacent semiconductor laminations.

13. The automotive lighting according to claim 12, wherein each of the first semiconductor layer, the active layer, the second semiconductor layer, and the undoped semiconductor layer are formed of gallium nitride series semiconductor.

14. The automotive lighting according to claim 13, wherein the support substrate is formed of silicon.

15. The automotive lighting according to claim 12, wherein each first electrode is a reflection electrode.

16. The automotive lighting according to claim 12, further comprising an under-fill material that is filled in the space and that supports the connection member.

17. A method of manufacturing a semiconductor light emitting element array comprising:

growing on a growth substrate an initial growth layer comprising an undoped semiconductor layer having an electrical insulating property and an optical propagating property;

growing a pair of adjacent semiconductor laminations, wherein each semiconductor lamination includes a first semiconductor layer of a first conductivity type on the initial growth layer, an active layer on the first semiconductor layer, and a second semiconductor layer of a second conductivity type different from the first conductivity type on the active layer;

selectively forming plural first electrodes for plural semiconductor light emitting elements on a surface of each second semiconductor layer, forming plural first adhesion layers covering the plural first electrodes, and defining plural first regions of the pair of adjacent semiconductor laminations covered by the plural first adhesion layers and a second region of the pair of adjacent semiconductor laminations where each second semiconductor layer is exposed, wherein the second region separates the plural first regions;

removing the second region of the pair of adjacent semiconductor laminations to expose the initial growth layer and so as to form a street between the pair of adjacent semiconductor laminations, and leaving the plural first regions of the pair of adjacent semiconductor laminations;

forming plural second adhesion layers selectively on a support substrate;

adhering the growth substrate and the support substrate in such a manner that the plural first adhesion layers and the plural second adhesion layers are brought into contact with each other, and melt-adhering the plural first and second adhesion layers to form a joined structure including the pair of adjacent semiconductor laminations and the support substrate;

removing the growth substrate from the joined structure to expose the initial growth layer;

removing the exposed initial growth layer in areas corresponding to the plural first regions of the pair of adjacent semiconductor laminations to expose the plural first semiconductor layers in the plural first regions, and leaving the initial growth layer in an area corresponding to the second region and adjacent portions of the plural first regions of the pair of adjacent semiconductor laminations, so as to form a connection member which is disposed to bridge over at least a part of the street between the pair of adjacent semiconductor laminations and which defines a space together with the support substrate and the pair of adjacent semiconductor laminations, wherein the connection member is located on the respective first semiconductor layers of the pair of adjacent semiconductor laminations; and selectively forming plural second electrodes on the exposed first semiconductor layers in the plural first regions.

18. The method of manufacturing the semiconductor light emitting element array according to claim 17, further comprising forming a fluorescent layer on the pair of adjacent semiconductor laminations and the connection member.

19. The method of manufacturing the semiconductor light emitting element array according to claim 17, further comprising after removing the second region of the pair of adjacent semiconductor laminations to expose the initial growth layer, and after leaving the plural first regions of the pair of adjacent semiconductor laminations, laminating a first layer having an electrically insulating property and a second layer having a light reflecting property on an exposed surface.

20. The method of manufacturing the semiconductor light emitting element array according to claim 17, wherein each of the initial growth layer, each first semiconductor layer, each active layer, and each second semiconductor layer are formed of gallium nitride series semiconductor.

* * * * *